(12) United States Patent
Ebert et al.

(10) Patent No.: US 7,299,155 B2
(45) Date of Patent: *Nov. 20, 2007

(54) METHOD AND APPARATUS FOR DECOMPOSING AND VERIFYING CONFIGURABLE HARDWARE

(75) Inventors: Jeffrey Allen Ebert, Half Moon Bay, CA (US); Ravi Venugopalan, Santa Clara, CA (US); Scott Carlton Evans, Santa Clara, CA (US)

(73) Assignee: Sonics, Incorporated, Mountain View, CA (US)

( * ) Notice: Subject to any disclaimer, the term of this patent is extended or adjusted under 35 U.S.C. 154(b) by 277 days.

This patent is subject to a terminal disclaimer.

(21) Appl. No.: 11/118,044

(22) Filed: Apr. 29, 2005

(65) Prior Publication Data

US 2005/0198611 A1 Sep. 8, 2005

Related U.S. Application Data

(63) Continuation-in-part of application No. 10/976,456, filed on Oct. 29, 2004, which is a continuation of application No. 10/293,734, filed on Nov. 12, 2002, now Pat. No. 6,816,814.

(51) Int. Cl.
*G06F 11/30* (2006.01)

(52) U.S. Cl. ............... 702/182; 702/57; 702/87

(58) Field of Classification Search ............ 702/57–59, 702/85, 117–123, 182, 189; 714/733, 738; 703/23, 25; 716/4, 5, 7, 12; 324/763, 765
See application file for complete search history.

(56) References Cited

U.S. PATENT DOCUMENTS

| | | | |
|---|---|---|---|
| 5,801,956 A | 9/1998 | Kawamura et al. | |
| 6,701,474 B2 * | 3/2004 | Cooke et al. | 714/724 |
| 6,816,814 B2 | 11/2004 | Ebert et al. | |
| 2002/0091979 A1 | 7/2002 | Cooke et al. | |
| 2002/0161568 A1 | 10/2002 | Sample et al. | |
| 2002/0171449 A1 | 11/2002 | Shimizu et al. | |
| 2003/0067319 A1 | 4/2003 | Cho | |

OTHER PUBLICATIONS

Thaker et al., "Register-Transfer Level Fault Modeling and Test Evaluation Techniques for VLSI Circuits", ITC International Test Conference, 2000 IEEE, Paper 35.3, pp. 941-949.

(Continued)

*Primary Examiner*—Eliseo Ramos-Feliciano
*Assistant Examiner*—Elias Desta
(74) *Attorney, Agent, or Firm*—Blakely Sokoloff Taylor & Zafman LLP

(57) ABSTRACT

The present invention includes a method and apparatus for decomposing and verifying configurable hardware. In one embodiment, the method includes automatically decomposing a set of one or more units at a first level of a configurable hardware system design hierarchy into a set of two or more units of a lower level of the hardware system design hierarchy. The set of one or more units at a first level includes one or more units dynamically instantiated at design creation time as well as at least a first unit composed of a previously instantiated hardware system composed with two or more levels of units within the hardware system design hierarchy of the previously instantiated hardware system.

22 Claims, 7 Drawing Sheets

OTHER PUBLICATIONS

VSI Alliance reference, "An Overview of VSIA" from http://www.vsi.org/aboutVSIA/index.htm, 2004, pp. 1 total.

Lin et al., "A Functional Test Planning System for Validation of DSP Circuits Modeled in VHDL", 1998 International Verilog, pp. 172-177.

Evans et al., "Honey I Shrunk the SOC Verification Proablem", Sonics, Inc., SNUG San Jose, 2001, 2001 pp. 11 total.

ALDEC, "What is TCL/TK Scripting?", Jan. 2002, ALDEC Support, pp. 1-9.

PCT Notification of Transmittal of International Preliminary Examination Report for Int'l. Application No. PCT/US03/35336, Int'l Filing Date Nov. 5, 2003, mailed May 31, 2005, 5 pgs.

* cited by examiner

METHOD AND APPARATUS FOR DECOMPOSING AND VERIFYING CONFIGURABLE HARDWARE

RELATED APPLICATIONS

The present patent application is a Continuation in part of prior application Ser. No. 10/976,456, filed Oct. 29, 2004, which was a Continuation of prior application Ser. No. 10/293,734, filed Nov. 12, 2002, entitled "A METHOD AND AN APPARTUS FOR DECOMPOSING AND VERIFYING CONFIGURABLE HARDWARE," and issued on Nov. 9, 2004 as U.S. Pat. No. 6,816,814.

FIELD

The present invention pertains to hardware verification. More particularly, the present invention relates to verifying configurable hardware.

BACKGROUND

"Configurable hardware" or "parameterized hardware" describes hardware systems that are customized automatically at design creation time by using specified values for a set of parameters or attributes. Such hardware may also support changes at run-time depending on parameter settings. Configurable hardware systems typically provide better performance than software running on a general-purpose computer system and greater flexibility than conventional application specific integrated circuits (ASICs) without increasing circuit size and cost.

In conventional hardware systems, it is necessary to verify a system's functionality by testing the system and its components. Typically, the complexity of verifying a system's functionality increases with the number of components that make up the system. Therefore, the conventional approach is to manually verify each unit individually and then to assemble the "known good units" into a system. If hardware is hierarchically arranged, verification must be performed for each level in the hierarchy. If each individual unit has been verified before assembling the system, verifying system functionality can focus on potential problems with interactions between components rather than on each component's capabilities.

Configurable hardware systems can be verified using this type of conventional hierarchical decomposition. However, because each instance of a configurable hardware system is different, each time a configuration parameter is modified, the system and its components must be manually verified. The cost of repeatedly manually verifying a system and its components often offsets the advantages of configurable hardware.

SUMMARY

The present invention includes a method and apparatus for decomposing and verifying configurable hardware. In one embodiment, the method includes automatically decomposing a set of one or more units at a first level of a configurable hardware system design hierarchy into a set of two or more units of a lower level of the hardware system design hierarchy, wherein the set of one or more units at a first level includes one or more units dynamically instantiated at design creation time as well as at least a first unit composed of a previously instantiated hardware system composed with two or more levels of units within the hardware system design hierarchy of the previously instantiated hardware system.

BRIEF DESCRIPTION OF THE DRAWINGS

Some embodiments of the invention are illustrated by way of example and not limitation in the Figures of the accompanying drawings, in which like references indicate similar elements and in which.

DETAILED DESCRIPTION

Figure 1:
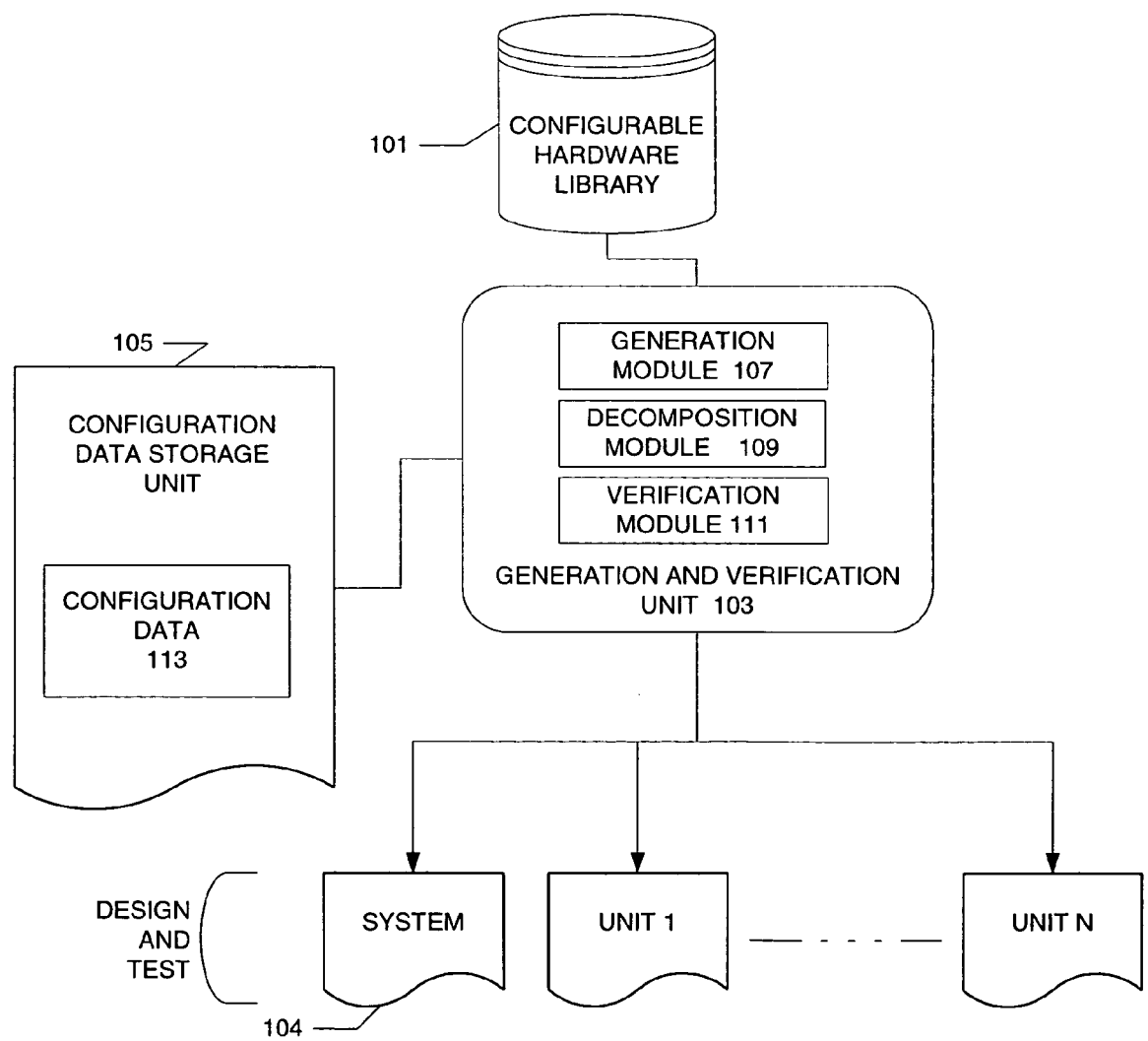
FIG. 1 is a block diagram for decomposing and verifying configurable hardware according to one embodiment of the invention.

In general, a method and apparatus for decomposing and verifying configurable hardware are described. Note, separate references to "one embodiment" in this description do not necessarily refer to the same embodiment; however, neither are such embodiments mutually exclusive, unless so stated and except as will be readily apparent to those skilled in the art. Further specific numeric references such as first memory, may be made. In general, the specific numeric reference should not be interpreted as a literal sequential order but rather interpreted that the first unit is different than a second unit. Thus, the specific details and implementations set forth are merely exemplary. Likewise, the present invention can include any variety of combinations and/or integrations of the example but not inclusive embodiments described herein.

Herein, block diagrams illustrate exemplary embodiments of the invention. Also herein, flow diagrams illustrate operations of the exemplary embodiments of the invention. The operations of the flow diagrams will be described with reference to the exemplary embodiments shown in the block diagrams. However, it should be understood that the operations of the flow diagrams could be performed by embodiments of the invention other than those discussed with reference to the block diagrams, and embodiments discussed with references to the block diagrams could perform operations different than those discussed with reference to the flow diagrams.

Overview

In one embodiment of the invention, a generation and verification unit generates a configurable hardware system based on configuration data and a configurable hardware library. The configurable hardware system is made up of a number of units. In one embodiment of the invention, the generation and verification unit hierarchically decomposes a configurable hardware system into units that make up the system design. Configuration data is applied to each unit so that it can be removed and verified or analyzed outside of the system without changing the unit itself. The generation and verification unit creates a testbench, tests, and controlling scripts for each unit.

Likewise, the generation and verification unit may automatically decompose a set of one or more units at a top level of a configurable hardware system design hierarchy into a set of two or more units of a lower level of the hardware system design hierarchy. The set of one or more units at a first lower level may include one or more units dynamically instantiated at design creation time. The set of one or more units at the first lower level may also include at least a first unit composed of a previously instantiated hardware system composed with two or more levels of units within the hardware system design hierarchy of the previously instantiated hardware system. Thus, the previous instantiated hardware system may be a completely functional system with all of its models and verification tests already generated. The previous instantiated hardware system may be being integrated into a new configurable hardware system as one part of that new system.

The generation and verification unit may individually verify units of each hierarchy level of the new configurable hardware system design hierarchy successively from the lower levels to the first level with testbenches. The testbenches being the units under test and the corresponding models. However beneficially, the sequences of test inputs for the previously instantiated hardware system may be reused when testing that previously instantiated hardware system in the new configurable hardware system.

Exemplary Architecture

FIG. 1 is a block diagram for decomposing and verifying configurable hardware according to one embodiment of the invention. FIG. 1 includes a generation and verification unit 103, which further includes a generation module 107, decomposition module 109, and verification module 111. The generation and verification unit 103 is connected to a configurable hardware library 101, and a configuration data storage unit 105. The configuration data storage unit 105 includes configuration data 113. The generation and verification unit 103 generates a configurable hardware system 104 and its constituent units (illustrated as units 1-N). One or more of the units stored in the configurable hardware library 101 may be a previously instantiated entire hardware system.

In a configurable hardware system design hierarchy, the term "system" refers to the composition of units at a particular hierarchy level, where details of the units are hidden. Therefore, at a particular level in a configurable hardware system design hierarchy, units are indivisible components. However, at lower hierarchy levels, the units from a higher level have their details and internal components exposed. For example, referring to FIG. 1, at one design hierarchy level, the system 104 is viewed as a "black box" unit of a larger system, where the details about units 1-N are concealed. However, at a lower design hierarchy level, the system 104 is viewed as including units 1-N, where the unit connection details are exposed. At even lower levels of the configurable hardware system design hierarchy, the internal details of units 1-N are exposed. At the lowest hierarchy level, a unit cannot be decomposed. The generation of system 104 and units 1-N will be described in more detail below in FIG. 4.

The configuration data storage unit 105 includes configuration data 113, which hierarchically describes a configurable hardware system. For example, the configuration data 113 specifies the system and unit parameters at all relevant hierarchy levels. While the end user sets most parameters in the configuration data 113, the generation and verification unit 103 sets some parameters during the hardware integration and/or decomposition process. The configuration data 113 for specific units may be supplied by a user through a text file, through input supplied by a user through a graphic user interface, or through a random configuration data generator. The configuration data 113 may be represented by any suitable electronic design automation scripting language, according to embodiments of the invention. In one embodiment of the invention, the configuration data 113 is represented in the tool control language (TCL) scripting language. In particular, the configuration data 113 may include a TCL text file defining a system design name, system-level parameters, unit-level names and parameters, unit-level connection parameters (e.g., number of wires in a signal bundle, handshaking protocols, pipelining behavior, etc.), and interface statements for binding unit instances to particular connections. In an alternative embodiment of the invention, this system information could be represented in the extensible markup language (XML) format or in a relational database.

Because multiple instances of any particular hardware unit can be included in a hardware system, each unit instance is uniquely named in the configuration data 113. Moreover, different instances of the same unit can be configured differently. For example, one instance of a FIFO may be configured to have a depth of 10 bytes, while another instance of a FIFO may be configured to have a depth of 100 bytes.

The configurable hardware library 101 describes all possible configurations of the system's hardware components. For example, the configuration hardware library 101 may describe all possible configurations of a FIFO, including its depth, width, and other configurable parameters. In one embodiment of the invention, the configurable hardware library includes hardware description language (HDL) code (e.g. Verilog or VHDL) embedded with preprocessing statements that describe how to interpret the configuration data 113.

The configurable hardware library 101 contains the code for an instance of each potential unit. Thus, the Hardware Description Language Code describing a particular unit's design is exactly the same as that used in the system (top) level. The code for an instance of that unit is obtained from the configurable hardware library 101 rather than having an existing unit regenerate itself. During verification merely, the testbench components remain to be generated for each unit. In this way the actual system generated from code in the library will have been tested and verified rather than instances of similar units being tested and verified. In an embodiment, the code for units may come from the configurable hardware library 101 and/or by having an existing unit regenerate itself.

Overall, the generation and verification unit 111 may automatically generate, decompose, and verify a configurable hardware system. A first instance of the configurable hardware system may be different in function than a second instance of the configurable hardware system. The generation and verification unit 111 may create code for each unique instance of a unit from configurable parameters based on configuration provided at design creation time.

Figure 2:
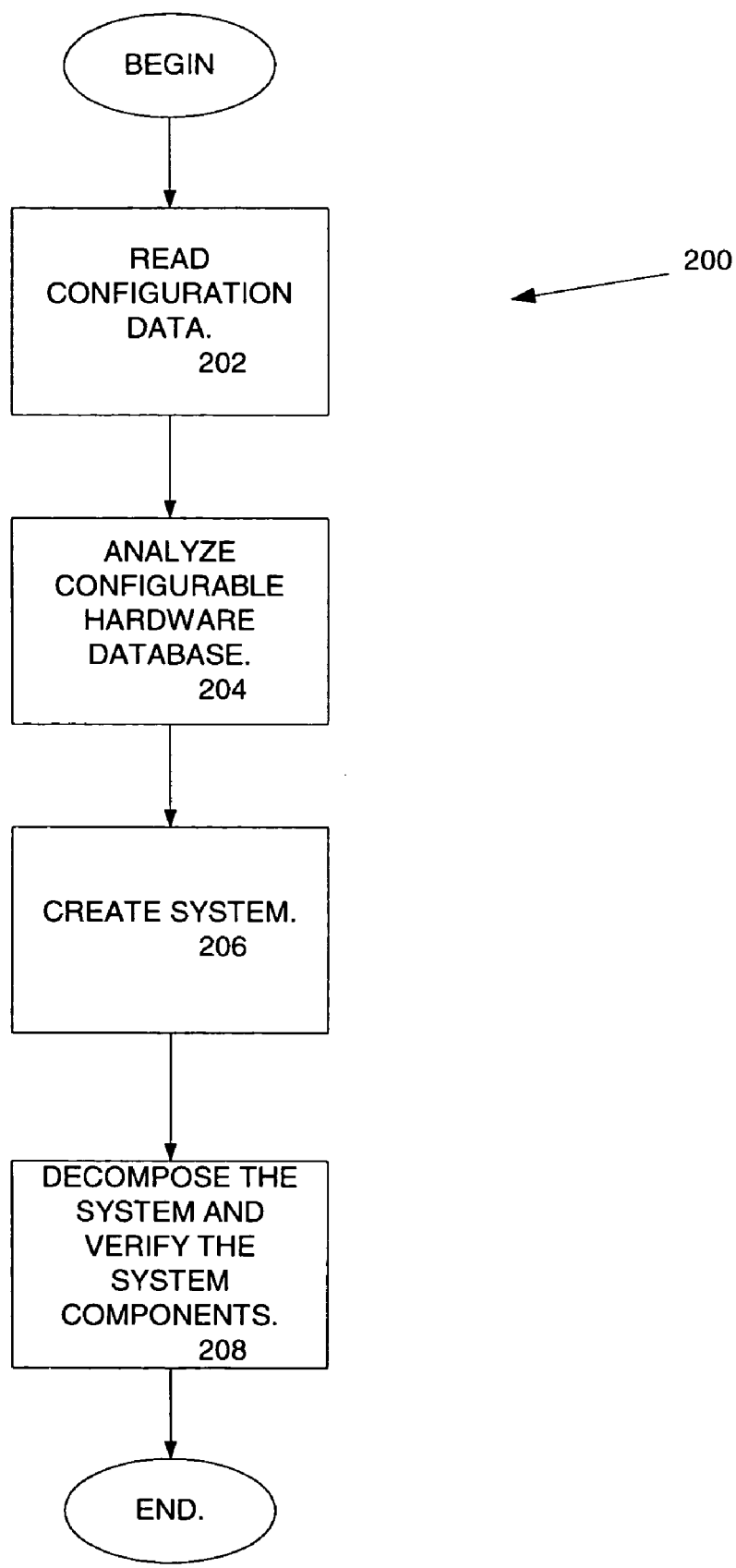
FIG. 2 is a block diagram illustrating a system for creating and verifying configurable hardware according to one embodiment of the invention.

FIG. 2 is a flow diagram illustrating the creation, decomposition, and verification of a configurable hardware system, according to embodiments of the invention. The operations of the flow diagram 200 will be described with reference to the block diagram of FIG. 1. At process block 202, the configuration data is read. For example, according to the embodiment of the invention illustrated in FIG. 1, the generation module 107 of the generation and verification unit 103 reads the configuration data 113 from the configuration data storage unit 105. As noted above, the configuration data 113 may be a TCL file that hierarchically defines a configurable hardware system. Control continues at block 204.

At block 204, the configurable hardware library is analyzed. For example, the generation module 107 analyzes the configurable hardware library 101 to determine the possible configurations of the hardware components necessary for generating the hardware system defined by the configuration data 113. Control continues at block 206.

As shown in block 206, a configurable hardware system is created. For example, the generation module 107 creates a configurable hardware system based on the configuration data 113 and the configurable hardware library 101. The operation of block 206 is further described below with reference to FIG. 3. Control continues at block 208.

At block 208, the system is decomposed and the system and its components are verified. For example, the decomposition module 109 and the verification module 111 decompose and verify the system components. The operation in block 208 will be described in more detail below in the discussion of FIG. 5.

It should be evident to one of ordinary skill in the art that the operations described in the flow diagram 200 could be repeated for generating and verifying hardware at any level in the hierarchical system design. For example, to verify a system at a particular hierarchy level, all of the system's components must be verified. This may require verifying lower level systems, which may in turn require verifying even lower level systems. Once the lowest level system is verified, the higher level systems may in turn be verified. Hence, the operations set forth in the flow diagram 200 can be repeated for creating and verifying systems and/or components at any design hierarchy level.

Thus, the generation and verification unit 111 may automatically decompose a set of one or more units at a top level of a configurable hardware system design hierarchy into a set of two or more units of a lower level of the hardware system design hierarchy. The set of one or more units, such as Unit 1-Unit N, at a first lower level may include one or more units dynamically instantiated at design creation time. The set of one or more units, such as Unit 1-Unit N, at the first lower level may also include at least a first unit composed of a previously instantiated hardware system composed with two or more levels of units within the hardware system design hierarchy of the previously instantiated hardware system. Thus, the previous instantiated hardware system may be a completely functional system with all of its models and verification tests already generated. The previous instantiated hardware system may be being integrated into a new configurable hardware system as one part of that new system.

The generation and verification unit 111 may individually verify units of each hierarchy level of the new configurable hardware system design hierarchy successively from the lower levels to the first level with testbenches. However beneficially, the sequences of test inputs for the previously instantiated hardware system may be reused when testing that previously instantiated hardware system in the new configurable hardware system.

The generation and verification unit 111 can integrate that existing design into a new system with additional units. The generation and verification unit 111 treats the existing configurable hardware system design as a single unit in the new system. The generation and verification unit 111 may reuse the sequences of test inputs previously constructed for the existing design when testing that single unit in the new system.

Figure 3:
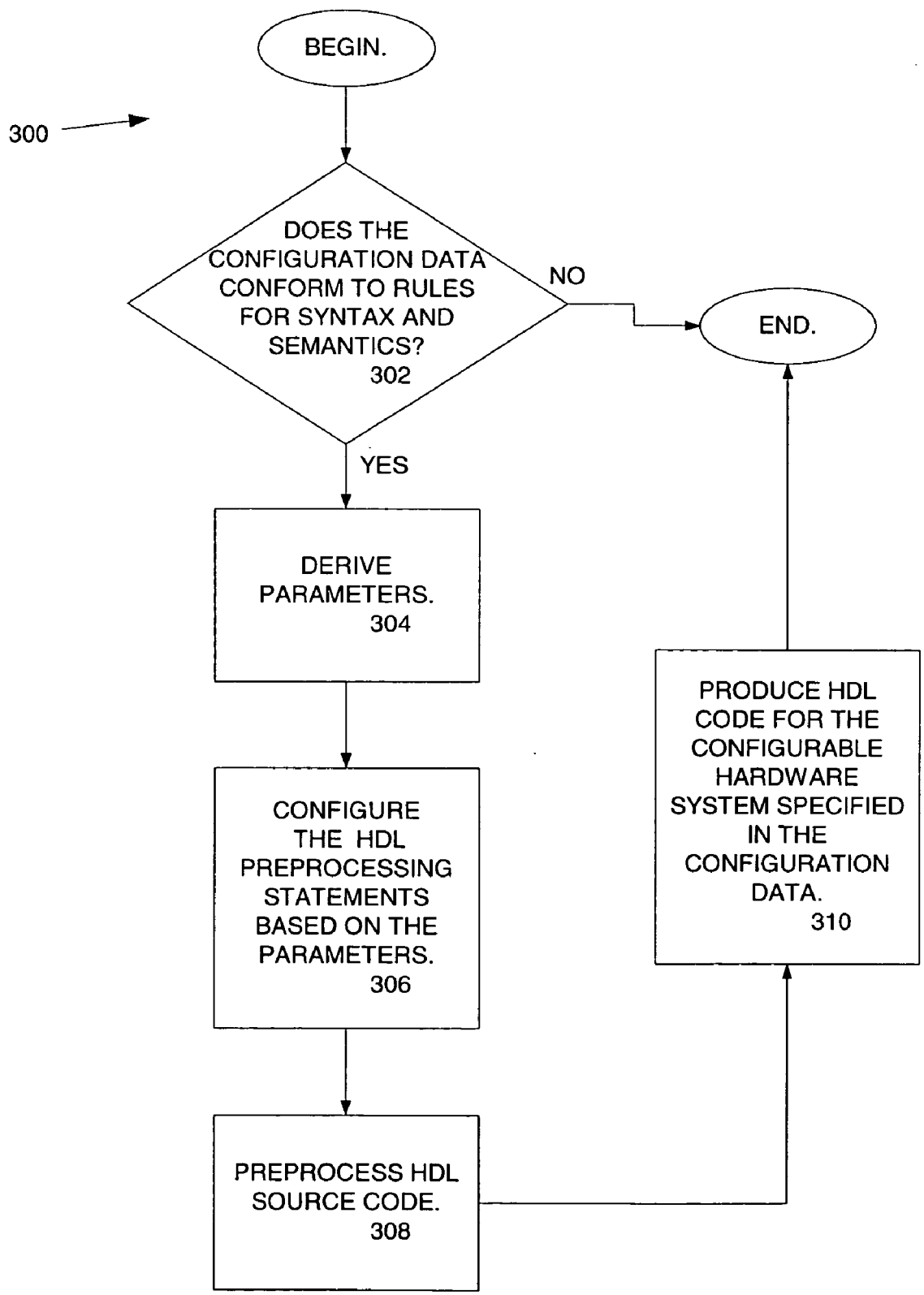
FIG. 3 is a flow diagram illustrating the creation of a system, according to embodiments of the invention.

FIG. 3 is a flow diagram illustrating the creation of a system, according to embodiments of the invention. The operations of the flow diagram 300 will be described with reference to the exemplary embodiment illustrated in FIG. 1. At decision block 302, it is determined whether the configuration data conforms to rules for syntax and semantics. For example, the verification module 111 determines whether configuration data 113 from the configuration data storage unit 105 conforms to rules for syntax and semantics. As a more specific example, in an embodiment where the configuration data 113 is represented by a TCL text file, the verification module 111 verification module 111 determines whether the TCL file conforms to the syntax and semantics rules of the HDL used by the configurable hardware library 101. In one embodiment, the verification module 111 verification module 111 employs a high-level language program (e.g., a C++, Python, or Java program) to analyze a TCL file for syntax and semantics. If the configuration data file conforms to the syntax and semantics rules, control continues at block 304. Otherwise, the flow ends with an error report. Control continues at block 304. Note, the verification module 111 may stipulate configuration data for a first unit to verify a specific set of parameters to cause a legal result for that set of parameters. The verification module 111 may stipulate configuration data for the first unit to verify a specific set of parameters intentionally causes a rule violation for that set of parameters prior to the first unit being part of a composed system or when the first unit is part of the composed system. Thus, the configuration data may be checked for errors at one or more points in the process.

At block 304, a set of parameters is derived for that unit. For example, the verification module 111 derives system parameters from the configuration data 113. As a more specific example, in one embodiment, the verification module 111 derives the system's parameters by analyzing a TCL file, which defines a configurable hardware system. For example, a system parameter may specify the minimum bandwidth required for an internal communications path. From this setting, parameters for specifying the number of wires used at various connection points in the system are derived according to the rules in the configuration data. Control continues at block 306.

As shown in block 306, the preprocessing statements are configured in code of a programming language based on the derived parameters. For example, in one embodiment of the invention, the verification module 111 configures HDL code preprocessing statements (stored in the configurable hardware library 101) that are affected by the specified and derived parameters. In doing this, the verification module 111 may impart particular values or control structures to preprocessor statements embedded in the HDL code. Control continues at block 308.

As shown in block 308, the HDL source code is preprocessed. For example, the verification module 111 preprocesses the HDL source code that was configured according to the derived parameters. In one embodiment of the invention, the verification module 111 includes a macro language preprocessor (e.g., a C preprocessor, an M4 preprocessor, or a SIMPLE preprocessor) for preprocessing the embedded HDL source code. Control continues at block 310. At block 310, the HDL code for the configurable hardware system specified in the configuration data is generated. For example, the verification module 111 generates the HDL code for the system specified in the configuration data 113 using HDL code from the configurable hardware library 101. The configured code in the programming language is processed to emit a hardware description of the unique instance of the unit. From block 310, control ends.

Figure 4:
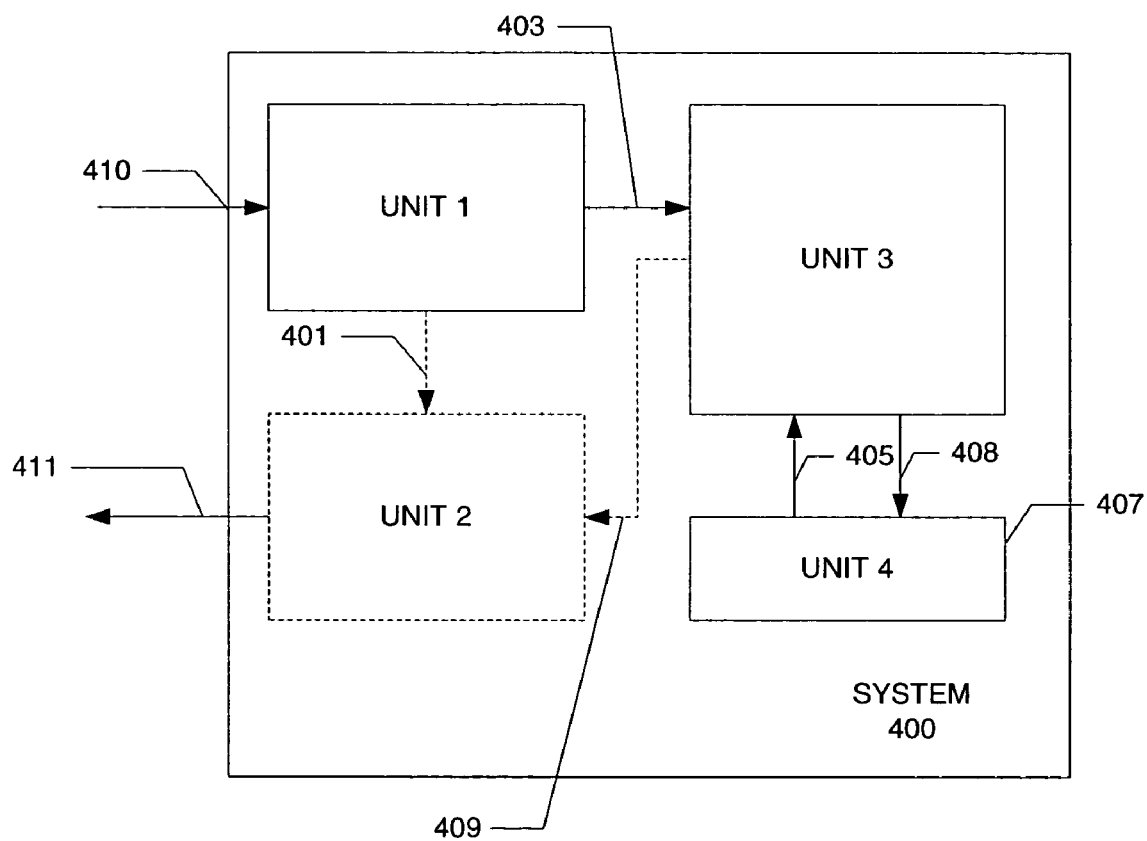
FIG. 4 is a conceptual block diagram of a system design according to embodiments of the invention.

FIG. 4 is a conceptual block diagram of a system design according to embodiments of the invention. As described above, according to an embodiment of the invention, the operations of FIG. 3 produce a system design represented in HDL code. FIG. 4 provides a graphical representation of such a system. FIG. 4 includes system 400, which includes unit 1, unit 2, unit 3, and unit 4. In system 400, unit 1 communicates to systems outside of the system 400 over a communication path 410. Unit 1 is coupled to unit 2 and unit 3 with communication paths 401 and 403, respectively. Unit 2 communicates with systems outside of system 400 through communication path 411. Unit 3 is coupled to unit 4 with communication paths 405 and 408. Unit 3 is also coupled to unit 2 with a communication path 409.

Unit 2, illustrated with broken lines, is an optional unit in the system 400. Connection paths 401 and 409 are also optional. For a given level of the system design hierarchy, a unit (or connection path) is optional when it is unknown whether factors external to the system will require the optional unit's functionality (e.g., a system at a higher level in the design hierarchy). For example, if system 400 could be configured to operate in two different modes, unit 2 would be optional if it's functionality were required by the first mode, but not by the second mode.

Accordingly, the topology of units in the first instance of the configurable hardware system can be modified at design creation time. The topology of units in a system includes, for example, the number of units and which other units connect to a particular unit. Such modification allows the topology of units in the first instance of the configurable hardware system to be different from the topology of units in the second instance of the configurable hardware system. Thus, the arrangement of units in a system including number of units, the size of the units, which other units connect to a particular unit, etc. can be modified at the design creation time.

The design creation time may be the design phase of an electronic system, such as a System on a Chip, which occurs before the fabrication of the electronic system. An electronic system design is typically functionally verified prior to the actual fabrication of the electronic system containing the design. Generally, as will be discussed in more detail later, in computer aided electronic system creation there exist two major stages: front-end processing and back-end processing.

Figure 5:
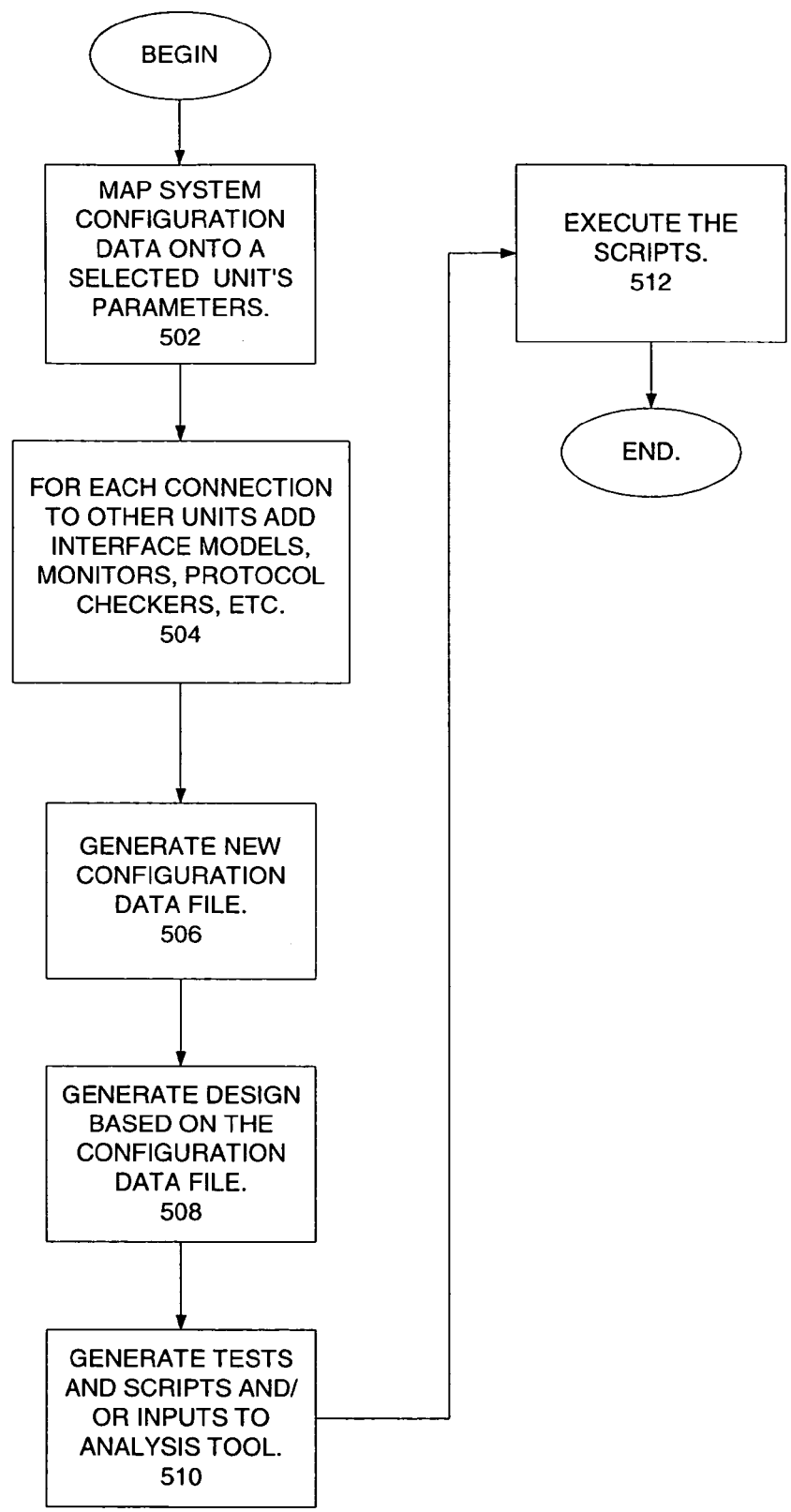
FIG. 5 is a flow diagram illustrating operations for decomposing and verifying a configurable hardware system according to embodiments of the invention.
Figure 6:
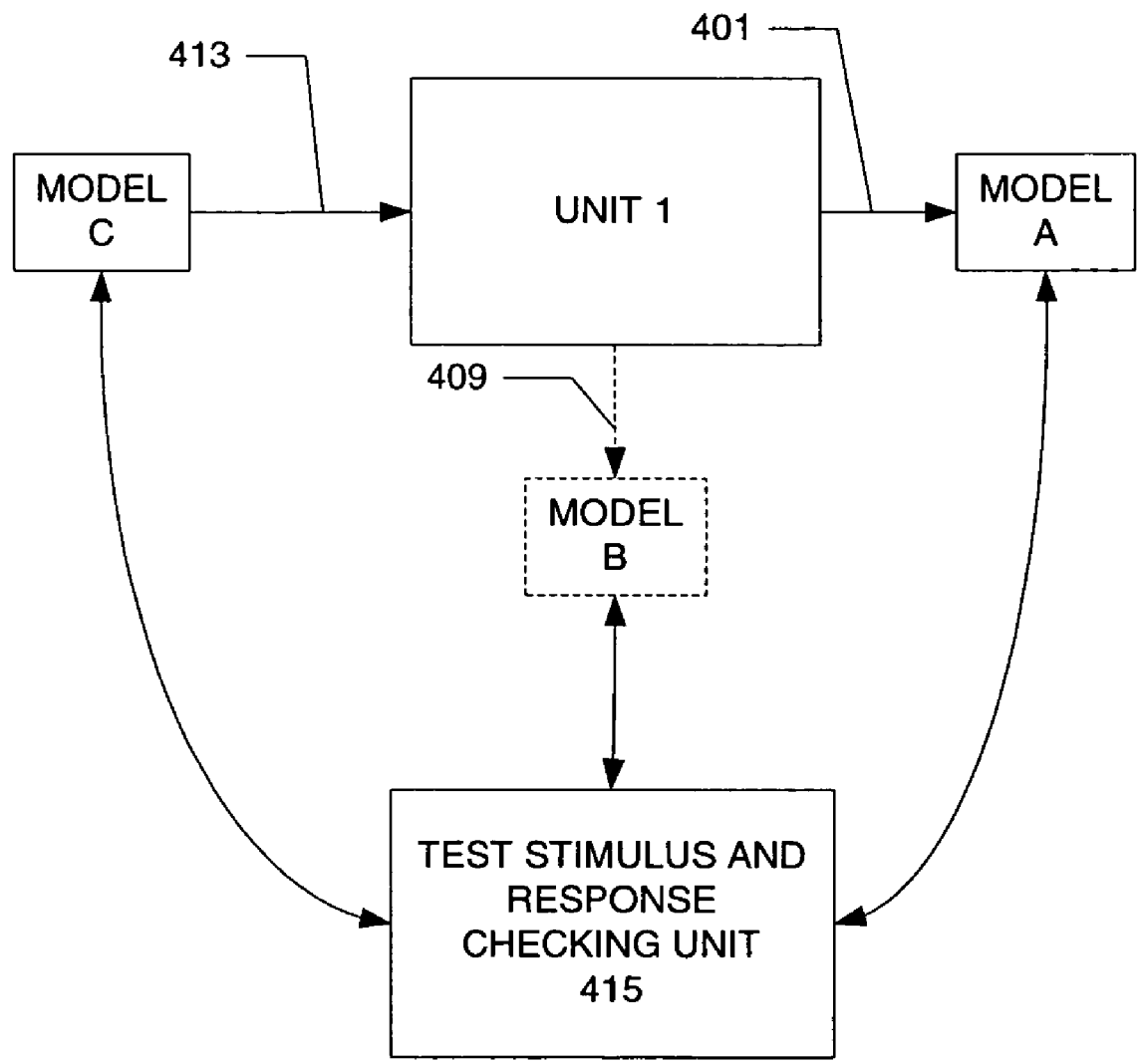
FIG. 6 is a block diagram illustrating a testbench for verifying a unit according to embodiments of the invention.

FIGS. 5 and 6 illustrate how system 400 is decomposed and verified according to embodiments of the invention. FIG. 5 is a flow diagram illustrating operations for decomposing and verifying a configurable hardware system according to embodiments of the invention. FIG. 6 is a block diagram illustrating a testbench for verifying a unit according to embodiments of the invention. FIGS. 5 and 6 will be described with reference to the exemplary system of FIG. 4 and the exemplary embodiment of FIG. 1.

Referring to the flow diagram of FIG. 5, at block 502, the configuration data 113 is mapped onto a selected unit's parameters. For example, the decomposition module 109 maps the configuration data 113 defining system 400 onto the parameters of a unit of system 400 (e.g., unit 1). As a more specific example, the decomposition module 109 analyzes the configuration data 113 to determine how unit 1's parameters should be configured to meet the requirements of system 400. Control continues at block 504.

At block 504, for each connection to other units, interface models, monitors, and/or protocol checkers are added to the unit. For example, the verification module 111 analyzes the configuration data 113 to determine the connections for the selected unit (e.g., unit 1). For each connection (e.g., communication path), the decomposition module 109 couples a model to the unit, which may include an interface driver model, an interface monitor, and/or a protocol checker. This operation is conceptually illustrated in FIG. 6. In FIG. 6, model A is connected to unit 1 through communication path 403, while model B is connected to unit 1 through communication path 401. Model C is connected to unit 1 through communication path 410. The test stimulus and response checking unit 415 is connected to models A, B, and C. The test stimulus and response checking unit 415 monitors and facilitates testing operations. In the testbench, models are used for sending and receiving information to the unit being verified. For example, models A and B will receive streams of data from unit 1 according to unit 1's parameters (e.g., according to the particular communication protocol defined for the particular communication path). Similarly, model C will transmit data to unit 1 according to unit 1's parameters. The particular data to be transmitted to and from the unit will be determined by the tests used for verifying the unit. These tests will be discussed in more detail below. From block 504, control continues at block 506.

At block 506, the configuration data is generated. For example, decomposition module 109 generates configuration data 113 specifying the selected unit's parameters. According to one embodiment of the invention, the decomposition module 109 generates configuration data 113 in the form of a TCL file, as described above in the discussion of FIG. 1. According to an alternative embodiment, the decomposition module 109 generates configuration data 113 in the form of an XML file.

At block 508, a design based on the configuration data 113 is generated. For example, the generation module 107 uses the configurable hardware library 101 to generate a configurable hardware system design based on the configuration data 113. This operation is described in more detail above, in the discussion of FIG. 3. In one embodiment, the design is represented by HDL code. Control continues at block 510.

At block 510, tests and scripts and/or inputs to an analysis tool are generated. For example, the verification module 111 generates tests and scripts for running the tests and/or inputs to analysis tools. From block 510, control continues at block 512. In generating the tests, the verification module 111 may use pre-existing tests that are known to verify the functionality of a particular unit or it may generate customized tests based on an analysis of the unit configuration. These tests will exercise and verify the functionality of the configured unit being tested. According to an embodiment of the invention, the verification module 111 generates tests that are capable of verifying any configuration of the unit. In this embodiment, the tests read the configuration data 113 and modify their stimulus accordingly while the test is running, rather than before testing begins. Accordingly, the sequences of test inputs for the one or more units dynamically instantiated at design creation time may be dynamically built at run time. The test generation may occur with run-time adaptation. Components and test sequences may be generated at run time rather than at compile time. Thus one program file determines what type and number of units are being tested and then another program generates the test sequences appropriate for those units. The verification module 111 can also generate scripts for automatically performing the tests.

As noted above, the verification module 111 may use pre-existing tests or it may generate customized tests based on an analysis of the unit configuration. Thus, the verification module 111 during verification can use an existing collection of test components including the unit and its associated models while replacing a previously generated set of test input sequences with an entirely new set of test input sequences. The verification module 111 may reuse old test components with new sequences of inputs other then the original series of test input sequences to the circuit formed from those test components.

Tests can be customized or replaced after testbenches are generated. In other words, the tests may be manipulated independently after the testbench is constructed.

As an additional or alternative form of testing, the verification module 111 provides the design to an analysis tool, which performs a static analysis of the design. For example, according to one embodiment of the invention, the verification module 111 provides the unit design represented by HDL code to a static verification tool that analyzes the HDL code for errors. In one embodiment, the static verification tool generates warnings and or error messages based on its analysis of the HDL code.

Thus, the generation and verification unit 103 may automatically decompose the configurable hardware system into the set of one or more units. The verification module 111 may create inputs into the static verification analysis tool that does not require an executing of a stimulus through the set of one or more units to verify the results of the static test. The static verification analysis may be performed as part of functional logic verification in a phase of electronic system and circuit design, which includes System on Chip design, to ensure that a configured logic design correctly implements the product specification for that logic design. The configurable hardware system may be customized at design creation time by using specified values for a set of parameters. Each instance of the configurable hardware system may be different in function than another instance of the configurable hardware system.

An embodiment of an IP analysis tool can run other analysis tools such as code coverage (particularly merging results from bottom up), lint, formal verification, power analysis, gate-level simulation (as opposed to RTL simulation). The static verification analysis tool may be the lint test that performs rule checking, the formal verification test that performs a mathematical proof, or similar tool that does not require an executing of a stimulus, such as test input sequences, through the hardware model to verify the results of the static test.

As shown in block 512, the scripts are executed. For example, the verification module 111 executes the scripts, which automatically test and verify the selected unit.

It should be apparent to one of ordinary skill in the art that the operations described in the flow diagram of FIG. 5 can be repeated to verify any unit/system at any level in a design hierarchy.

Referring to FIG. 1, the generation and verification unit 103, configurable hardware library 101, and configuration data storage unit 105 may be implemented in the form of a conventional computing platform, including one or more processors, application specific integrated circuits (ASICs), memories, and/or machine readable media whereon instructions are stored for performing operations according to embodiments of the invention. Machine-readable media includes any mechanism that provides (i.e., stores and/or transmits) information in a form readable by a machine (e.g., a computer). For example, a machine-readable medium includes read only memory (ROM); random access memory (RAM); magnetic disk storage media; optical storage media; flash memory devices; electrical, optical, acoustical or other form of propagated signals (e.g., carrier waves, infrared signals, digital signals, etc.); etc. In one embodiment, the units shown in FIG. 1 are machine readable media executing on a processor to carryout the operations described herein. However, in alternative embodiments, the units of FIG. 1 are other types of logic (e.g., digital logic) for executing the operations described herein. Alternatively, according to one embodiment of the invention, the generation and verification unit 103, configurable hardware library 101, and configuration data storage unit 105 can include one or more separate computer systems. It should also be understood that, according to embodiments of the invention, the components illustrated in FIG. 1 could be distributed over a number of networked computers, wherein they could be remotely controlled and operated.

Figure 7:
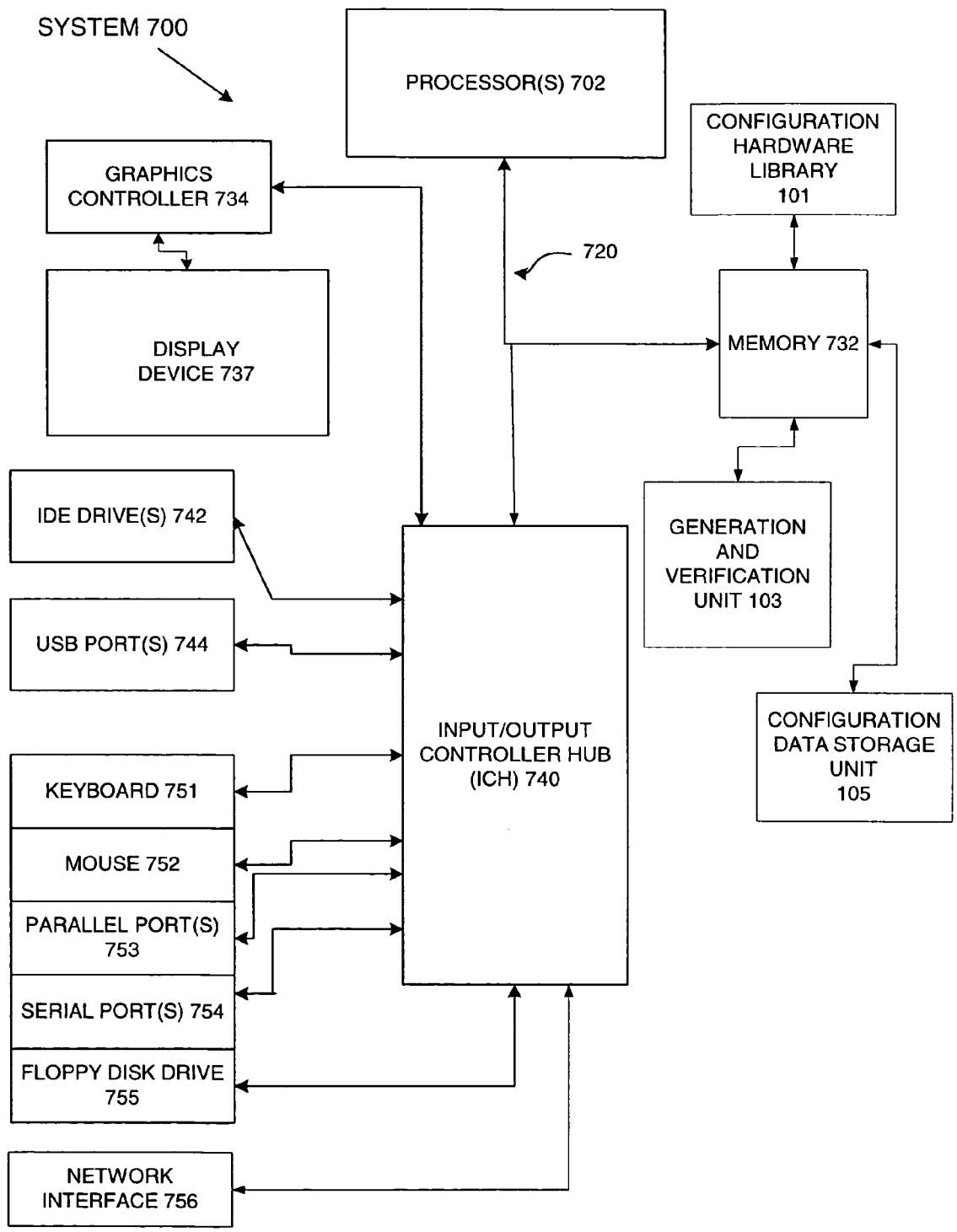
FIG. 7 illustrates an exemplary system for decomposing and verifying configurable hardware, according to embodiments of the invention.

FIG. 7 illustrates an exemplary system for decomposing and verifying configurable hardware, according to embodiments of the invention. As illustrated in FIG. 7, computer system 700 comprises processor(s) 702. Computer system 700 also includes a memory 732, processor bus 710 and input/output controller hub (ICH) 740. The processor(s) 702, memory 732 and ICH 740 are coupled to the processor bus 710. The processor(s) 702 may comprise any suitable processor architecture. For other embodiments of the invention, computer system 700 may comprise one, two, three, or more processors, any of which may execute a set of instructions that are in accordance with embodiments of the present invention.

The memory 732 stores data and/or instructions, and may comprise any suitable memory, such as a dynamic random access memory (DRAM), for example. In one embodiment of the invention, the configuration hardware library 101, generation and verification unit 103, and configuration data storage unit 105 are stored in memory 732. However, they may be stored in any or all IDE drive(s) 742, memory 732, and/or other suitable storage devices. A graphics controller 734 controls the display of information on a display device 737, according to embodiments of the invention.

The input/output controller hub (ICH) 740 provides an interface to I/O devices or peripheral components for computer system 700. The ICH 740 may comprise any suitable interface controllers to provide for any suitable communication link to the processor(s) 702, memory 732 and/or to any suitable device or component in communication with the ICH 740. For one embodiment of the invention, the ICH 740 provides suitable arbitration and buffering for each interface.

For one embodiment of the invention, the ICH 740 provides an interface to one or more suitable integrated drive electronics (IDE) drives 742, such as a hard disk drive (HDD) or compact disc read only memory (CD ROM) drive for example, to store data and/or instructions for example, one or more suitable universal serial bus (USB) devices through one or more USB ports 744. For one embodiment of the invention, the ICH 740 also provides an interface to a keyboard 751, a mouse 752, a floppy disk drive 755, one or more suitable devices through one or more parallel ports 753 (e.g., a printer), and one or more suitable devices through one or more serial ports 754. For one embodiment of the invention, the ICH 740 also provides a network interface 756 though which the computer system 700 can communicate with other computer and/or devices.

Accordingly, computer system 700 includes a machine-readable medium on which is stored a set of instructions (i.e., software) embodying any one, or all, of the methodologies described herein. For example, software can reside, completely or at least partially, within memory 732 and/or within processor(s) 702.

As discussed, the software used to facilitate aspects of an electronic circuit and system design process can be embodied onto a machine-readable medium. A machine-readable medium includes any mechanism that provides (e.g., stores and/or transmits) information in a form readable by a machine (e.g., a computer). The information representing the apparatuses and/or methods stored on the machine-readable medium may be used in the process of creating the apparatuses and/or methods described herein. For example, the information representing the apparatuses and/or methods may be contained in an Instance, soft instructions in an IP generator, soft instructions in a testbench tool, or similar machine-readable medium storing this information.

The IP generator may be used for making highly configurable hardware systems. In an embodiment, an example intellectual property generator may comprise the following: a graphic user interface; a common set of processing elements; and a library of files containing design elements such as circuits, control logic, and cell arrays that define the intellectual property generator. In an embodiment, a designer chooses the specifics of the configurable hardware system to produce a set of files defining the requested configurable hardware system instance. The configurable hardware system instance may include front-end views and back-end files.

Front-end processing consists of the design and architecture stages, which includes design of the SOC schematic. The front-end views support documentation, simulation, debugging, and testing. The front-end processing may include connecting models, configuration of the design, simulating and tuning during the architectural exploration. The design is simulated and tested. Front-end processing traditionally includes simulation of the circuits within the SOC and verification that they work correctly. The integration of the electronic circuit design may include packing the cores, verifying the cores, simulation and debugging.

Back-end processing traditionally includes programming of the physical layout of the SOC such as placing and routing, or floor planning, of the circuit elements on the chip layout, as well as the routing of all interconnects between components. The back-end files, such as a layout, physical LEF, etc are for layout and fabrication. Thus, the floor plan may be generated imported and edited. After this, the design may be outputted into a Netlist of one or more hardware design languages (HDL) such as Verilog, VHDL or Spice. A Netlist describes the connectivity of an electronic design such as the components included in the design, the attributes of each component and the interconnectivity amongst the components. After the Netlist is generated synthesizing may occur. Accordingly, back-end processing further comprises the physical verification of the layout to verify that it is physically manufacturable and the resulting SOC will not have any function-preventing physical defects. If there are defects, the placement of circuit elements and interconnect routing is revisited, which requires one or more revisions to the Netlist. Such a process can lead to increased design time, since the physical placement of the components happens much later in the design stages.

While the invention has been described in terms of several embodiments, those skilled in the art will recognize that the invention is not limited to the embodiments described. For example, units in a configurable hardware system may be expressed in a general programming language instead of a hardware description language. The configurable hardware code may be represented in the general-purpose programming language. Such configurable hardware code emits a hardware description when executed. Scripts written in the general purpose programming language may be used to generate the code to create units in the configurable hardware system and to create tests to functionally verify those units. C++, Java, Python, natively or derivations of, may all be examples of general programming languages. Similarly, SystemC may be used for hardware modeling and testing rather then a hardware description language. The functions of one module may be combined with another module or spread out into two or more discrete modules. The method and apparatus of the invention can be practiced with modification and alteration within the spirit and scope of the appended claims. The description is thus to be regarded as illustrative instead of limiting on the invention.

We claim:

1. A method, comprising:
    automatically decomposing a set of one or more units at a first level of a configurable hardware system design hierarchy into a set of two or more units of a lower level of the hardware system design hierarchy, wherein the set of one or more units at a first level includes one or more units dynamically instantiated at design creation time as well as at least a first unit composed of a previously instantiated hardware system composed with two or more levels of units within the hardware system design hierarchy of the previously instantiated hardware system; and
    individually verifying units of each hierarchy level of the hardware system design hierarchy successively from the lower levels to the first level with testbenches, wherein the sequences of test inputs for the previously instantiated hardware system are reused when testing that previously instantiated hardware system in the configurable hardware system.

2. The method of claim 1, further comprising:
    using a general purpose programming language to create units in the configurable hardware system and to create tests to functionally verify those units.

3. The method of claim 1, wherein a first unit in a configurable hardware system is expressed in a general programming language instead of a hardware description language.

4. The method of claim 1, further comprising:
    dynamically building at run time, sequences of test inputs for the one or more units dynamically instantiated at design creation time.

5. An apparatus generated by the method of claim 1.

6. A machine readable medium that contains instructions, which when executed by the machine to cause the machine to perform the operations of claim 1.

7. The method of claim 1, further comprising:
    using a SystemC programming language to create units in the configurable hardware system and to create tests to functionally verify those units.

8. The method of claim 1, further comprising:
    using a Hardware Description Language to create units in the configurable hardware system and to create tests to functionally verify those units.

9. An apparatus, comprising:
    a generation and verification unit to automatically generate, decompose, and verify a configurable hardware system; wherein a first instance of the configurable hardware system is different in function than a second instance of the configurable hardware system, and the generation and verification unit to create code for a unique instance of a unit from configurable parameters based on configuration data provided at design creation time.

10. The apparatus of claim 9, wherein the generation and verification unit creates code for the unique instance of the unit from configurable parameters based on configuration data using a verification module that determines:
  whether the configuration data conforms to rules for syntax and semantics;
  what a set of derived parameters should be for that unit; and
  processes configured code in a programming language to emit a hardware description of the unique instance of the unit.

11. The apparatus of claim 9, wherein the generation and verification unit creates code for the unique instance of the unit from configurable parameters based on configuration data using the verification module that determines:
  whether the configuration data conforms to rules for syntax and semantics;
  what a set of derived parameters should be for that unit; and
  configures code in a programming language with preprocessing statements based on the set of derived parameters.

12. The apparatus of claim 9, wherein the generation and verification unit has a generation module to determine at design creation time a topology of units in a first instance of the configurable hardware system, and the topology of units in the first instance of the configurable hardware system is different from the topology of units in a second instance of the configurable hardware system.

13. The apparatus of claim 9, wherein the generation and verification unit includes
  a hardware library to store a previously instantiated collection of test components including a first unit and its associated models; and
  a verification module to replace a first set of test input sequences with a second set of test input sequences to execute on the test components.

14. The apparatus of claim 9, wherein the generation and verification unit has a decomposition module to determine at run time what type and number of units are being tested to allow test sequences appropriate for those units to be generated.

15. The apparatus of claim 9, wherein the configurable hardware system is for a System on a Chip.

16. The apparatus of claim 9, wherein the generation and verification unit has a verification module to obtain configuration data for a first unit to verify if a specific set of parameters causes a legal result or a rule violation for the specific set of parameters prior to the first unit being part of a composed system.

17. The apparatus of claim 9, wherein the generation and verification unit has a generation module to receive configuration data for a first unit supplied by a user through a text file, supplied by a user through a graphic user interface, or supplied through a random configuration data generator.

18. The apparatus of claim 9, further comprising
  a library to store code in a programming language for an instance of a unit, wherein the generation and verification unit to obtain the code for a first instance of the unit from the library.

19. A method, comprising:
  automatically decomposing a configurable hardware system into a set of one or more units;
  creating inputs into a static verification analysis tool that does not require an executing of a stimulus through the set of one or more units to verify the results of the static test; and
  performing the static verification analysis as part of functional logic verification in a phase of electronic system and circuit design to ensure that a configured logic design correctly implements a product specification for that logic design, wherein the configurable hardware system is customized at design creation time by using specified values for a set of parameters and a first instance of the configurable hardware system is different in function than a second instance of the configurable hardware system.

20. The method of claim 19, wherein the electronic system and circuit design is for a System on a Chip.

21. An apparatus generated by the method of claim 19.

22. A machine readable medium that contains instructions, which when executed by the machine to cause the machine to perform the operations of claim 19.

* * * * *